United States Patent
Shen

(10) Patent No.: US 7,525,307 B2
(45) Date of Patent: Apr. 28, 2009

(54) SYSTEM AND METHOD FOR HARD DRIVE COMPONENT TESTING

(75) Inventor: Yong Shen, Saratoga, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 294 days.

(21) Appl. No.: 11/646,812

(22) Filed: Dec. 27, 2006

(65) Prior Publication Data

US 2008/0157760 A1 Jul. 3, 2008

(51) Int. Cl.
*G01R 33/12* (2006.01)

(52) U.S. Cl. .................................................. 324/210

(58) Field of Classification Search ......... 324/210–212, 324/260; 360/6, 25, 31
See application file for complete search history.

(56) References Cited

U.S. PATENT DOCUMENTS

| | | | |
|---|---|---|---|
| 5,719,796 A | 2/1998 | Chen | |
| 5,966,312 A | 10/1999 | Chen | |
| 6,006,614 A | 12/1999 | Guzik et al. | |
| 6,023,145 A | 2/2000 | Karaaslan et al. | |
| 6,157,189 A * | 12/2000 | Stark et al. | 324/212 |
| 6,249,392 B1 | 6/2001 | Sacks et al. | |
| 6,263,303 B1 | 7/2001 | Yu et al. | |
| 6,353,806 B1 | 3/2002 | Gehlot | |
| 6,389,384 B1 | 5/2002 | Hampshire et al. | |
| 6,654,195 B1 | 11/2003 | Frank | |
| 6,696,831 B2 | 2/2004 | Nozu et al. | |
| 6,754,030 B2 | 6/2004 | Seng et al. | |
| 6,777,929 B2 | 8/2004 | Fang et al. | |
| 6,807,518 B1 | 10/2004 | Lang | |
| 6,876,894 B1 | 4/2005 | Chen et al. | |
| 6,892,170 B1 | 5/2005 | Du et al. | |
| 6,934,671 B2 | 8/2005 | Bertsch et al. | |
| 7,046,471 B2 * | 5/2006 | Meyer et al. | 360/75 |

* cited by examiner

*Primary Examiner*—Jay M Patidar

(57) ABSTRACT

Embodiments of the present invention include a method and System for Hard Drive component testing, particularly for magnetic recording head testing. The method of testing magnetic recording heads includes: performing a magnetic write width test (on a plurality of disk drive heads), sorting the plurality of heads into a first group and a second group based on the magnetic write width test, testing the first group with signal to noise ratio tests with adjacent tracks present under a first set of parameters, wherein the first set of parameters are based on the magnetic write width test, testing the second group with signal to noise ratio tests with adjacent tracks present under a second set of parameters, wherein the second set of parameters are based on the magnetic write width test.

20 Claims, 6 Drawing Sheets

500

```
           ┌─────────┐
           │  Start  │
           └────┬────┘
                ▼
┌──────────────────────────────────────────────────┐
│ Performing a magnetic write width test on a      │
│ plurality of disk drive heads.                   │
│ 502                                              │
└──────────────────────┬───────────────────────────┘
                       ▼
┌──────────────────────────────────────────────────┐
│ Sorting said plurality of heads into a first     │
│ group and a second group based on said magnetic  │
│ write width test.                                │
│ 504                                              │
└──────────────────────┬───────────────────────────┘
                       ▼
┌──────────────────────────────────────────────────┐
│ Testing said first group for signal to noise     │
│ ratios with adjacent tracks present under a      │
│ first set of parameters, wherein said first set  │
│ of parameters are based on said magnetic write   │
│ width test.                                      │
│ 506                                              │
└──────────────────────┬───────────────────────────┘
                       ▼
┌──────────────────────────────────────────────────┐
│ Testing said second group for signal to noise    │
│ ratios with adjacent tracks present under a      │
│ second set of parameters, wherein said second    │
│ set of parameters are based on said magnetic     │
│ write width test.                                │
│ 508                                              │
└──────────────────────┬───────────────────────────┘
                       ▼
                  ┌─────────┐
                  │   End   │
                  └─────────┘
```

FIG. 5

SYSTEM AND METHOD FOR HARD DRIVE COMPONENT TESTING

FIELD OF THE INVENTION

The present invention relates to hard drive component testing and more particularly to recording head testing.

BACKGROUND OF THE INVENTION

Disk drives are information storage devices that utilize at least one rotatable disk with concentric data tracks containing the information, a head or transducer for reading data from or writing data to the various tracks, and a head positioning actuator connected to the head for moving it to the desired track and maintaining it over the track during read and write operations. The head is fabricated in an air-bearing slider, which is supported adjacent to the data surface of the disk by a cushion of air generated by the rotating disk. The head can also be attached to a contact recording type slider. In either case, the slider is connected to a support arm of the transducer-positioning actuator by means of a suspension.

As disk drives have become smaller in size and higher in capacity, the recorded track density has increased dramatically. This has necessitated the use of magnetic recording heads with smaller and smaller critical dimensions in both reader and writer heads to generate and read narrower data tracks. However, these smaller geometries of the head make manufacture much more difficult as performance and design requirements are increasingly precise. Under conventional methods heads are tested under fixed test conditions after they have been mounted on to a Head Gimbal Assembly (herein HGA).

Testing under fixed test conditions, which deviates from drive format and test conditions, presents at least two problems: 1) missing bad parts during screening, 2) rejection of good parts. First, all bad heads need to be screened out as completely to reduce costs. Bad heads that escape the screening process result in loses as a result of reduce costs. Bad heads that escape the screening process result in loses as a result of defective hard drives. Second, the number of good parts that are rejected needs to be minimized in order to keep costs down. Any good part that is incorrectly rejected results in increased overall head cost. Additionally, long test times result in substantial costs and testing often requires labor time as well the costly equipment

SUMMARY OF THE INVENTION

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

Embodiments of the present invention include a method and system for hard drive recording head testing. The method of testing recording heads includes: performing a magnetic write width test on a plurality of disk drive heads, sorting the plurality of heads into a first group and a second group based on the magnetic write width test, testing the first group for signal to noise performance with adjacent tracks present under a first set of parameters, wherein the first set of parameters are based on the magnetic write width test, testing the second group for signal to noise performance with adjacent tracks present under a second set of parameters, wherein the second set of parameters are based on the magnetic write width test.

BRIEF DESCRIPTION OF THE DRAWINGS

The above and other objects and advantages of the present invention will be more readily appreciated from the following detailed description when read in conjunction with the accompanying drawings, wherein:

FIG. 5 is a flowchart of an exemplary method for testing a head of a hard drive in accordance with embodiments of the present invention.

DETAILED DESCRIPTION

Reference will now be made in detail to embodiments of the present invention, a method and system for hard drive component testing, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Generally speaking, in one embodiment of the invention a write width test is performed on a plurality of heads of hard drives. Then based on the results of the write width test the plurality of heads is split up into two or more groups, upon which signal to noise ratios are measured with adjacent tracks present to simulate hard drive formats so that the heads can be sorted in various grades. These grades are then used to determine if and in what capacity hard drive the head will be used. This testing and grading process results in substantial cost savings resulting from increased part utilization, lower rejection of good parts, and reduced test time.

Figure 1:
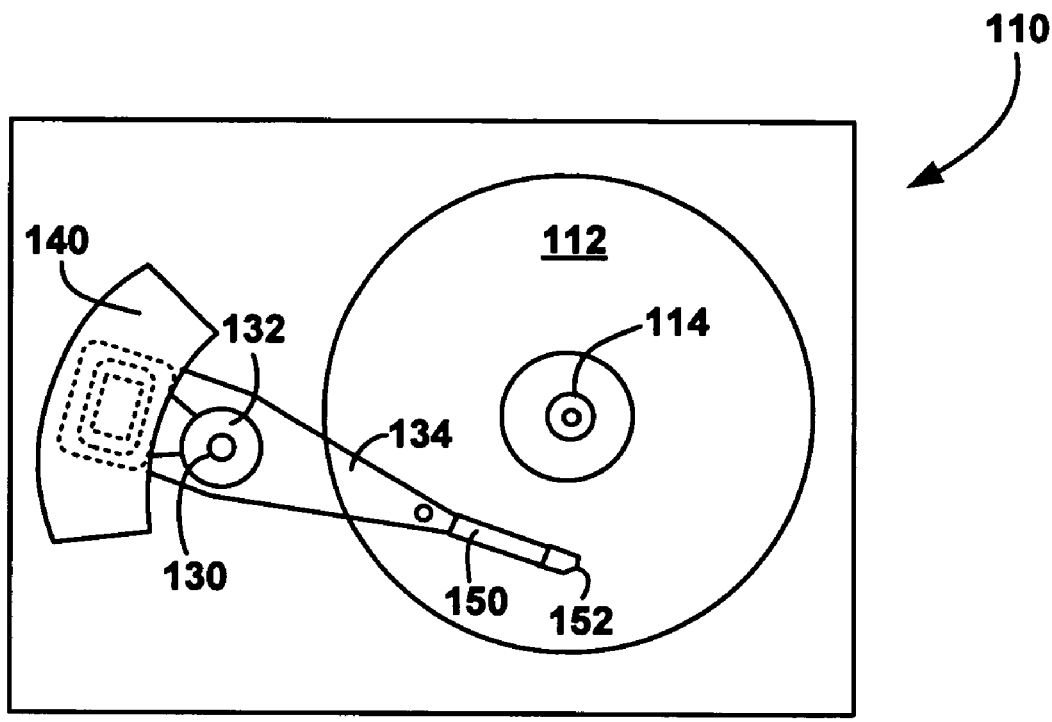
FIG. 1 is a top view of an exemplary disk drive system in accordance with embodiments of the present invention.

FIG. 1 shows a top view of a disk drive system designated by the general reference number 110. The disk drive system 110 comprises a plurality of stacked magnetic recording disks 112 mounted to a spindle 114. The disks 112 may be conventional particulate or thin film recording disks or, in other embodiments, they may be liquid bearing disks. A hub assembly 132 rotates about the actuator shaft 130 and supports a plurality of actuator arms 134. The stack of actuator arms 134 is sometimes referred to as a "comb". A rotary voice coil motor 140 is attached to the rear portion of the actuator arms 134.

A plurality of suspension assemblies 150 are attached to the actuator arms 134. A plurality of heads or transducers on sliders 152 are attached respectively to the suspension assemblies 150. The sliders 152 are located proximate to the disks 112 so that, during operation, the heads or transducers are in electromagnetic communication with the disks 112 for reading and writing. The rotary voice coil motor 140 rotates actuator arms 134 about the actuator shaft 130 in order to move the suspension assemblies 150 to the desired radial position on disks 112. The shaft 130, hub 132, arms 134, and motor 140 may be referred to collectively as a rotary actuator assembly.

Figure 2:
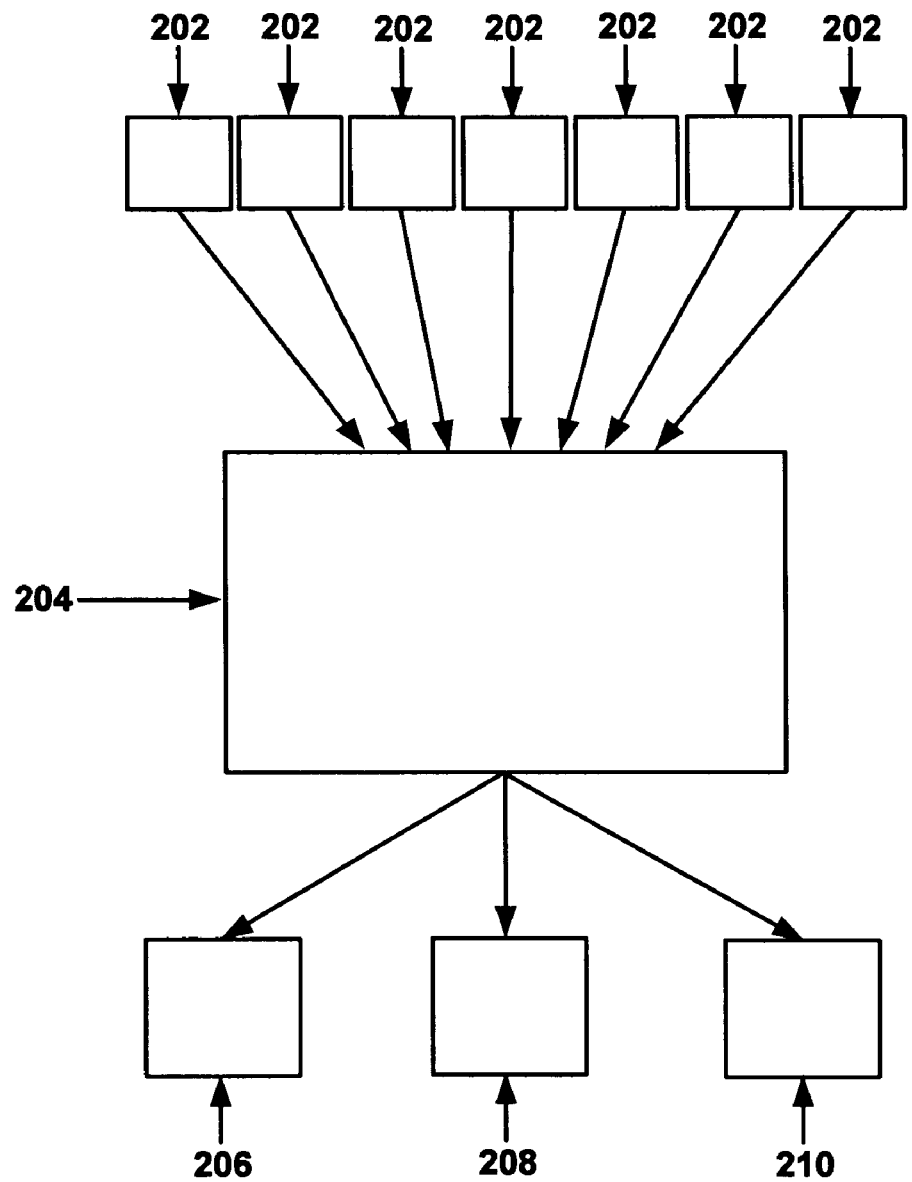
FIG. 2 is a flowchart of an exemplary process for testing recording heads in accordance with embodiments of the present invention.

FIG. 2 is an exemplary flowchart of a process for testing hard drive components in accordance with embodiments of the present invention. FIG. 2 illustrates the input of a plurality of heads 202 of hard drives into a head grading process 204 which results in the sorting of the plurality of heads 202 of hard drives into a plurality of grades. In one embodiment, a magnetic write width test will be performed first, followed by signal to noise ratio tests under a given set of test conditions consistent with hard disk drive formatting and finally a grading or sorting. In another embodiment of the invention, overwrite and/or stability testing may be done during the magnetic write width testing. This further reduces the testing time and thus reduces cost.

The grades may include a high grade 206, a medium grade 208 and a low grade 210 based on the signal to noise ratio tests. In another embodiment of the invention, the grading may be based on the signal to noise ratio and other tests. In one embodiment, the high grade 206 corresponds to heads 202 of hard drives that have the best performance and capacity characteristics. For example, the heads 202 in the high grade 206 may be used in more expensive drives such as higher density or multi platter drives.

In one embodiment, the medium grade 208 may correspond to heads 202 of hard drives that have the medium or relatively lower performance and capacity characteristics than high grade 206. For example, the medium grade 208 may be used in lower capacity drive than the high grade 206 heads or single platter drives. This allows the heads to be used instead of scrapped as they don't perform at the same level as the high grade 206 heads. This results in substantial cost savings as heads 202 that would otherwise be thrown away or scrapped can now be used in hard drives. In another embodiment, medium grade 208 heads may be used in combination in a hard drive with other grade heads. For example, a medium grade 208 head and a high grade 206 head could be combined in a drive to achieve a capacity higher than high grade 206 head could provide alone. In another example, two or more medium grade 208 heads could be used in a single drive to achieve a capacity equal to or greater than with a single high grade 206 head. Thus, medium grade 208 heads are utilized in actual drives where they might otherwise not under conventional methods which rejects all heads but the highest grades. This will result in substantial cost savings as an increased portion of the heads 202 are utilized in final hard drive products.

The low grade 210 may correspond to heads that are of relatively lower performance and capacity characteristics than medium grade 208. In one embodiment of the invention, the low grade 210 may be scrapped or thrown away. In another embodiment of the invention, the low grade heads may be used in even lower capacity drives. Thus, the overall process increases the number of heads that are used for a given head production resulting in increased profits and a reduction of good parts that would otherwise be rejected.

Figure 3:
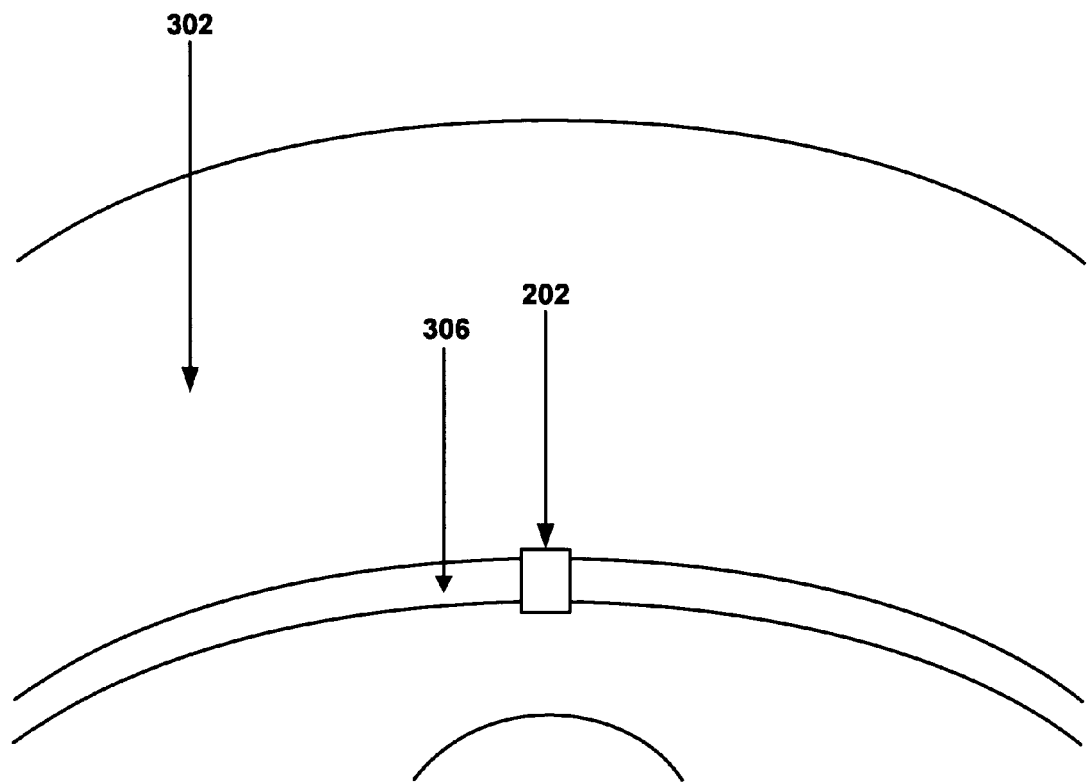
FIG. 3 is a top view of an exemplary write width test in accordance with embodiments of the present invention.

FIG. 3 is an exemplary top view of a magnetic tester 300 in accordance with one embodiment of the present invention. Magnetic tester 300 includes recording head 202 and media 302. The writer in recoding head 202 writes a track 306 on media 302 which is then read by reader in head 202. During this reading, read head measures the track width. In one embodiment, the track width can be used to define test conditions which are consistent with track density, namely, the Track per Inch (TPI)—Bit Per Inch format for use in subsequent testing. In one embodiment of the invention, the results of the write width test are used to sort the plurality of heads 202 into two groups. For example, one group may meet the write width requirements while the second group does not. These may be referred to as full capacity and relaxed capacity groups respectively.

In another embodiment of the invention, overwrite testing may be done concurrently with the write width testing. In yet another embodiment of the invention, stability testing may be performed concurrently with the write width testing. The performing of these tests currently with the magnetic write width tests rather than later will result further times saving and thus cost savings.

Figure 4:
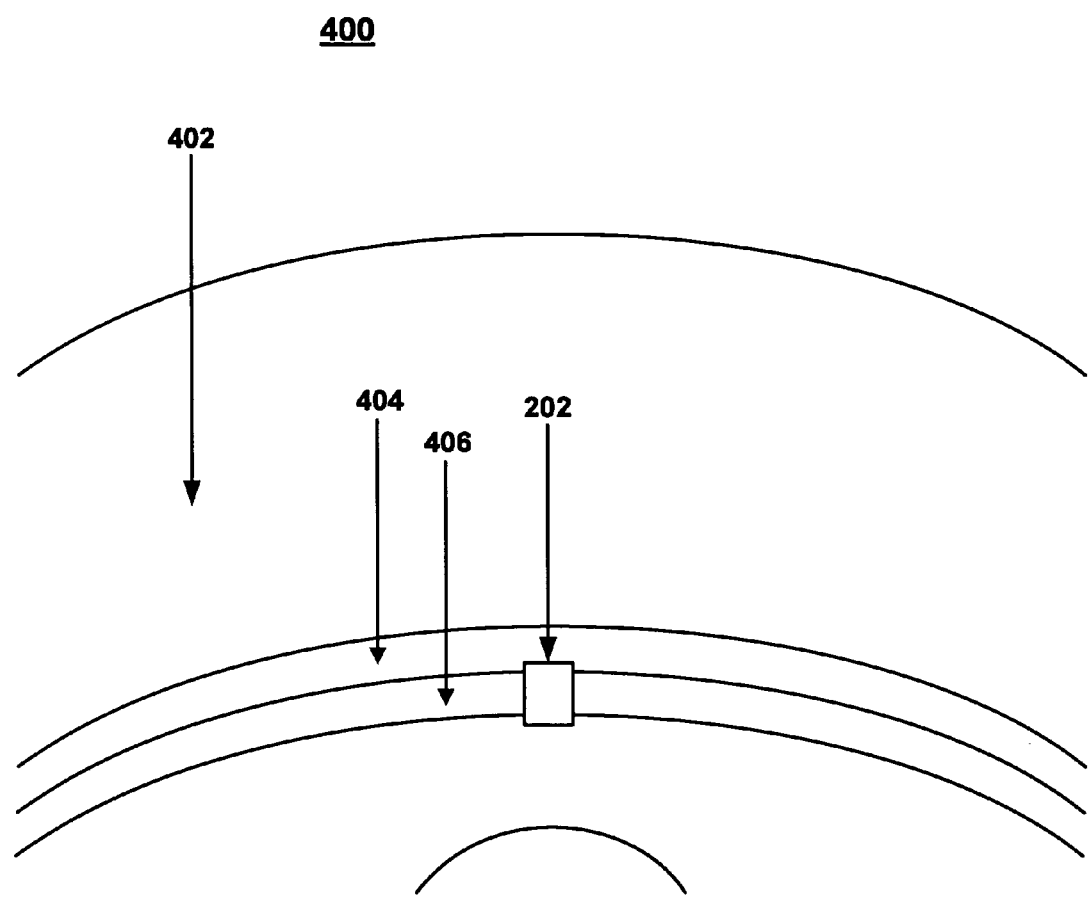
FIG. 4 is a top view of an exemplary test with adjacent tracks present in accordance with embodiments of the present invention.

FIG. 4 is an exemplary top view of a signal to noise tests with adjacent tracks present with tester 400 in accordance with one embodiment of the invention. The tester 400 includes media 402, a track being written 406, an adjacent track 404, a head 202. The writer in head 202 writes to media 402 on track 406. The reader in head 202 reads the data track 406 to determine the signal to noise ratio with adjacent track 404 present to take track interference effects into consideration.

The tests with adjacent tracks placed closer than the track pitch are often termed as squeeze tests. The squeeze test is typically done such that the tracks are overlapping when the test is done to determine how much the adjacent tracks interfere. For example, the squeeze tests may be done with an overlap percentage which is a percent of the track pitch or adjacent track distance. For example, this percentage may be varied from 0-20% such that the tests are conducted from 100% to 80% of the track pitch. Squeeze tests can be done in at least two ways. First, a single sided test in which a single data track is written and then the adjacent track written, upon which the data track is analyzed for interference. Secondly, a double sided test where a data track is written and then adjacent tracks on each side are written, upon which the data track is analyzed for track interference. In general, a single sided squeeze test may be performed in order to save time over doing a double sided test.

In one embodiment, the signal to noise ratio tests with adjacent tracks present will be done under varying Track Per Inch (herein TPI) parameters which are based on the Bits Per Inch (BPI) measured during the write width test. First, the signal to noise ratios with adjacent tracks present will be measured when the head 202 is writing at its BPI average and TPI average. Second, the signal to noise ratios with adjacent tracks present will be measured when the head 202 is writing at its BPI maximum and TPI minimum. Third, the signal to noise ratios with adjacent tracks present will be measured when the head 202 is writing at its BPI minimum and TPI maximum. Each group of heads 202 will be evaluated under these conditions based on the results of the write width tests. Thus, one set of conditions will be used to test the heads 202 that met the higher capacity requirements during the write width test while another set will used for the heads 202 which did not meet the capacity requirements during the signal to noise ratio tests with adjacent tracks present.

From the signal to noise ratio measurements, the heads will then be sorted into various grades. The signal to noise ratio tests are used because they are well correlated with drive level bit error rate testing. The signal to noise ratio tests may be used in place of a Bit Error Rate (BER) test as they require less time.

In one embodiment, the first group that met the high capacity requirements may be sorted into a high grade, medium grade and a low grade. The high grade may be heads that satisfied the write width test and the signal to noise ratio tests with adjacent tracks present. The medium grade may be heads that satisfied the write width test but did not sufficiently satisfy the signal to noise ratio tests with adjacent tracks present but did meet relaxed requirements for the signal to noise ratio tests with adjacent tracks present. The low grade may be composed of heads that satisfied the write width test but then did not satisfy the higher capacity based signal to noise ratio tests with adjacent tracks present under any requirements. In one embodiment, the low grade will be scrapped or thrown out.

In one embodiment, the second group that met the relaxed or lower capacity requirements may be sorted into a medium grade and a low grade. The medium grade may be heads that satisfied the relaxed write width test and sufficiently satisfied the signal to noise ratio tests with adjacent tracks present. The low grade may be composed of heads that satisfied the relaxed write width test but then did not satisfy the signal to noise ratio tests with adjacent tracks present. In one embodiment, the low grade will be scrapped or thrown out.

Sorting into grades allows greater use of a set of heads 202 of which more would be rejected under conventional methods due to not satisfying the initial higher capacity requirements. The testing and associated grading can be done faster than current testing methods thus saving money and time.

FIG. 5 is a flowchart of an exemplary method 500 for testing heads of hard drive in accordance with one embodiment of the present invention. With reference to step 502 of FIG. 5 and to FIG. 3, one embodiment provides a head 202 to be tested by a magnetic tester 300. The writer in head 202 is used to write a track on media 306 which is then read by reader in head 202 to determine the track width based on the TPI and BPI format of the track. This track width is used to determine whether a given head 202 will be able satisfy the capacity requirements of the drive the head 202 may eventually be used in. In another embodiment of the invention, stability testing may be done concurrently with the magnetic write width testing. Overwrite testing may also be done concurrently with the magnetic write width testing. The performing of these tests concurrently with the magnetic write width test rather than later results in time savings and thus cost savings.

With reference now to step 504 of FIG. 5, one embodiment provides sorting the plurality of heads in a first group and a second group based on the write width test. In one embodiment of the invention, this sorting may be based on the TPI-BPI format written during the write width test. The first group may be heads 202 that satisfy the capacity requirements for the drive that the heads may eventually be used in. Thus, this first grade may be referred to as a full capacity group. The second group may be heads that do not satisfy the requirements of the intended drive but will satisfy lower requirements. Thus, the second grade may be referred to as a relaxed group.

With reference to step 506 of FIG. 5 and to FIG. 4, one embodiment provides signal to noise ratio testing the first group of heads 202 with adjacent tracks present under a first set of parameters. These parameters are based on the write requirements of the disk that the head 202 may be used in. The signal to noise ratio tests with adjacent tracks present may be further customized for the final drives that the heads will go into such as higher disk capacity or multi-platter hard drives.

In one embodiment, the signal to noise ratio tests with adjacent tracks present will be done under varying TPI parameters which are based on the BPI measured during the write width test. First, the signal to noise ratio tests with adjacent tracks present will be measured when the head 202 is writing at its BPI average and TPI average. Second, the signal to noise ratio tests with adjacent tracks present will be measured when the head 202 is writing at its BPI maximum and TPI minimum. Third, the signal to noise ratio tests with adjacent tracks present will be measured when the head 202 is writing at its BPI minimum and TPI maximum.

In one embodiment of the invention, the signal to noise tests with adjacent tracks present may be performed by doing squeeze tests with squeeze ratio varying from 0-20%. Squeeze tests can be done in at least two ways: 1) a single sided test in which a single data track is written and then writing the adjacent track, then analyzing the data track for interference and 2) double sided test where a data track is written followed by the writing of both adjacent tracks and then analyzing the data track for interference.

With reference to step 508 of FIG. 5 and to FIG. 3, one embodiment provides testing the second group of heads 202 for signal to noise ratio tests with adjacent tracks present under a second set of parameters. This second set of parameters corresponds to the use of one of the heads 202 in a lower capacity media than the first group of heads. In one embodiment, the signal to noise ratio tests with adjacent tracks present will be done under varying TPI parameters which are based on the BPI measured during the write width test. First, the signal to noise ratio tests with adjacent tracks present will be measured when the head 202 is writing at its BPI average and TPI average. Second, the signal to noise ratio tests with adjacent tracks present will be measured when the head 202 is writing at its BPI maximum and TPI minimum. Third, the signal to noise ratio tests with adjacent tracks present will be measured when the head 202 is writing at its BPI minimum and TPI maximum. Each group of heads 202 of the second group will be evaluated under these conditions. These parameters may be such that they correspond to the requirements of the hard drive for lower capacity than the first group.

In one embodiment of the invention, the signal to noise ratio tests with adjacent tracks present may be performed by doing squeeze tests with squeeze ratio varying from 0-20%. Squeeze tests can be done in at least two ways: 1) a single sided test in which a single data track is written, subsequently writing the adjacent track and then analyzing the data track for interference and 2) double sided test where a data track is written followed by writing both adjacent tracks and analyzing the data track for interference.

In one embodiment of the invention, once the signal to noise ratios have been measured, the first group of heads may be sorted into various grades. The grading may be based on the signal to noise ratio measurements. In another embodiment of the invention, the grading can be based on the signal to noise ratio and other measurements or tests. The grades may be a high grade, medium grade and a low grade. The high grade may contain heads that satisfied the write width, signal to noise ratio tests with adjacent tracks present requirements of the final disk drive that the head may be used to build. The heads in this high grade may be used in more expensive drives such as mobile or server hard drives. The high grade heads may also be used in multi platter drives as the cost increases substantially as more platters are used.

The medium grade of the first group may be heads that either satisfied the write width test but did not sufficiently satisfy the write interference and signal to noise ratio tests. The heads from the medium grade may be used in single platter drives with a lower capacity than drives with high grade heads and thus optimizing cost.

The low grade may be composed of heads that satisfied the write width test but then did not satisfy the higher capacity based signal to noise ratio tests or heads that did not satisfy the write width test and then did not satisfy the lower capacity signal to noise ratio tests. In one embodiment, the low grade will be scrapped or thrown out. In another embodiment of the invention, the low grade heads may be used in lower capacity drives than both the high and medium grades, further optimizing costs.

In one embodiment of the invention, once the signal to noise ratio testing has been performed the second group of heads 202 may be sorted into grades. The grades may be a medium grade and a low grade. The sorting into grades may be based solely on signal to noise ratio measurements. In another embodiment of the invention, the sorting into grades may be based on signal to noise ratio measurements as well as other tests. The medium grade may be heads that do satisfy the relaxed write width requirements and sufficiently satisfy the write interference and signal to noise ratio tests. The heads from the medium grade could be used in single platter drives with a lower capacity than drives with high grade heads and thus optimizing cost.

The low grade may be composed of heads that satisfied relaxed requirements of the write width test but then did not satisfy the signal to noise ratio tests. In one embodiment, the low grade will be scrapped or thrown out. In another embodiment, the low grade heads may be used in drives of capacities lower than the medium grade. In one embodiment of the invention, the medium and low grades from the first and second group may be combined and then used in drives according to the capacities they support.

Figure 6:
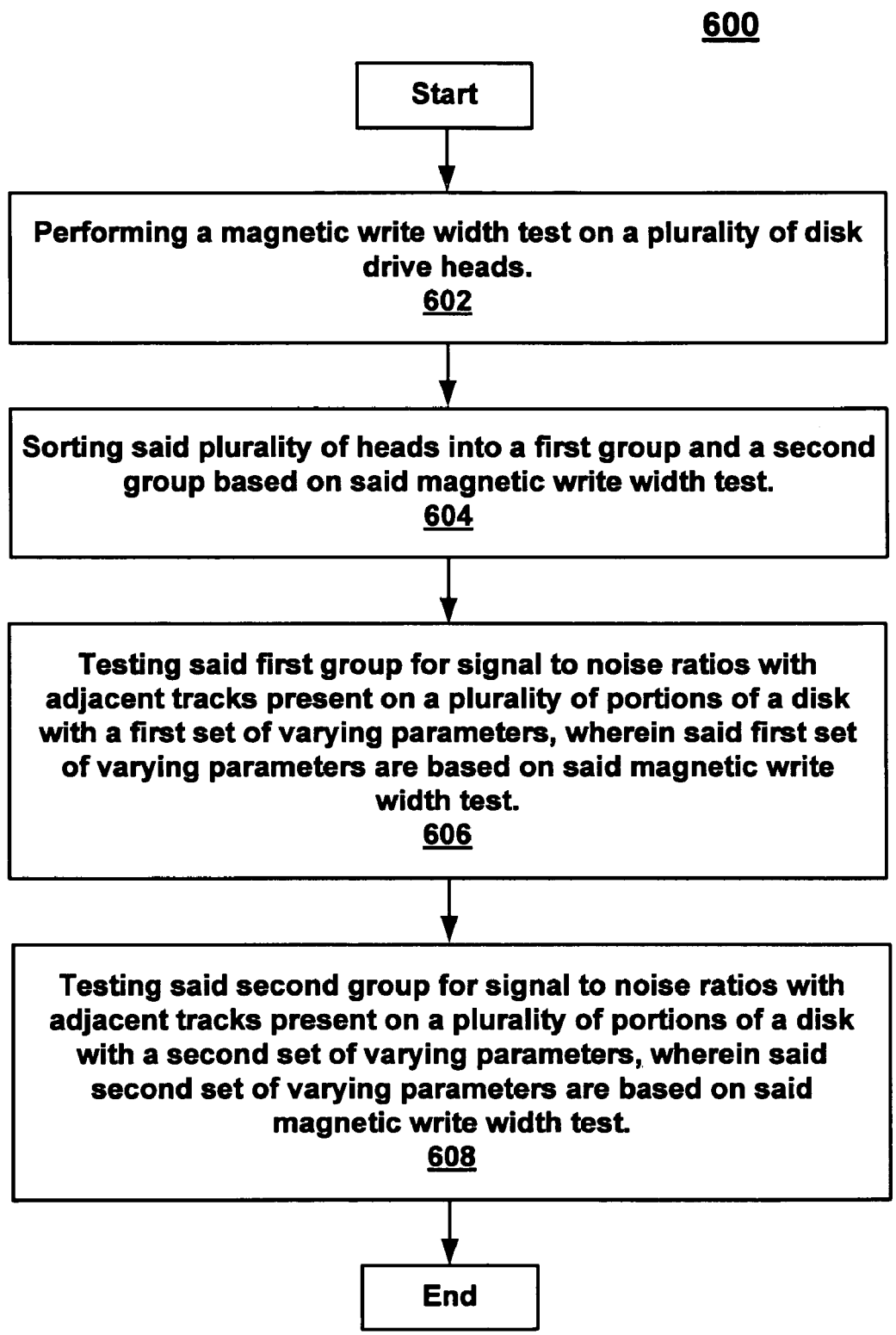
FIG. 6 is a flowchart of an exemplary enhanced method for testing a head of a hard drive in accordance with embodiments of the present invention.

FIG. 6 is a flowchart of an exemplary enhanced method 600 for testing heads of hard drives in accordance with one embodiment of the present invention. With reference to step 602 of FIG. 6 and to FIG. 3, one embodiment provides a head 202 to be tested by a magnetic tester 300. The head 202 is used to write a track on media 306 which is then read by read head 304 to determine the track width based on the TPI and BPI format of the track. This track width is used to determine whether a given head 202 will be able satisfy the capacity requirements of the drive the head 202 may eventually be used in. In another embodiment of the invention, stability testing may be done concurrently with the magnetic write width testing. Overwrite testing may also be done concurrently with the magnetic write width testing. The performing of these tests concurrently with the magnetic write width test rather than later results in time savings and thus cost savings.

With reference now to step 604 of FIG. 6, one embodiment provides sorting the plurality of heads in a first group and a second group based on the magnetic write width test. In one embodiment of the invention, this sorting may be based on the TPI-BPI format written during the write width test. The first group may be heads 202 that satisfy the capacity requirements for the drive that the heads may eventually be used in. Thus, this first grade may be referred to as a full capacity group. The second group may be heads that don't satisfy the requirements of the intended drive but will satisfy lower requirements. Thus, the second grade may be referred to as a relaxed group.

With reference to step 606 of FIG. 6 and to FIG. 4, one embodiment provides testing the first group of heads 202 for signal to noise ratio tests with adjacent tracks present on a plurality of portions of a disk with a first set of varying parameters. For example, the portions of the disk may correspond to sectors of the disk. This varying of the conditions on different portions of the disk allows more conditions to be tested at a single test cycle. The overall result is that time and therefore cost is reduced. These parameters are based on the write requirements of the disk that the head 202 may be used in. The signal to noise ratio tests may be further customized for the final drives that the heads will go into such as more expensive hard drives with higher densities or multiple platters.

In one embodiment, the signal to noise ratio tests with adjacent tracks present will be done under a fixed BPI and varying TPI parameters which are based on the BPI measured during the write width test. For the testing the BPI will be fixed at the BPI average. First, the signal to noise ratio tests with adjacent tracks present will be measured when the head 202 is writing at its BPI average and TPI average on a first portion of the disk. Second, the signal to noise ratio tests with adjacent tracks present will be measured when the head 202 is writing at its BPI average and TPI minimum on a second portion of the disk. Third, the signal to noise ratio tests with adjacent tracks present will be measured when the head 202 is writing at its BPI average and TPI maximum on a third portion of the disk. This fixing of the BPI at the average BPI allows faster testing as less parameters are varied and thus less information must be written in order to test performance.

In one embodiment of the invention, the signal to noise ratio tests with adjacent tracks present may be performed by doing squeeze tests with squeeze ratio varying from 0-20%. Squeeze tests can be done in at least two ways: 1) a single sided test in which a single data track is written followed by the adjacent track being written and finally analyzing the data track for interference and 2) double sided test where a data track is written followed by the writing of the two adjacent tracks and then analyzing the data track for interference.

With reference to step 608 of FIG. 6 and to FIG. 4, one embodiment provides signal to noise ratio testing of the second group of heads 202 with adjacent tracks present on a plurality of portions of a disk with a first set of varying parameters. For example, the portions of the disk may correspond to sectors of the disk. This varying of the conditions on different portions of the disk allows more conditions to be tested at a single test cycle. The overall result is that time and therefore cost is reduced. This second set of parameters corresponds to the use of one of the heads 202 in a lower capacity media than the first group of heads. In one embodiment, the signal to noise ratio tests with adjacent tracks present will be done under a fixed BPI and varying TPI parameters which are based on the BPI measured during the write width test. For the test the BPI will be fixed at the BPI average. First, the signal to noise ratios with adjacent tracks present will be measured when the head 202 is writing at its BPI average and TPI average on a first portion of the disk. Second, the signal to noise ratios with adjacent tracks present will be measured when the head 202 is writing at its BPI average and TPI minimum on a second portion of the disk. Third, the signal to noise ratios with adjacent tracks present will be measured when the head 202 is writing at its BPI average and TPI maximum on a third portion of the disk. This fixing of the BPI at the average BPI allows faster testing as less parameters are varied and thus less information must be written in order to test performance.

In one embodiment of the invention, the signal to noise ratio tests with adjacent tracks present may be performed by doing squeeze tests with squeeze ratio varying from 0-20%.

Squeeze tests can be performed in at least two ways: 1) a single sided test in which a single data track is written followed by writing the adjacent track, then analyzing the data track for interference and 2) double sided test where a data track is written followed by writing the two adjacent tracks and analyzing the data track for interference.

In one embodiment of the invention, once the signal to noise ratios have been measured, the first group of heads may be sorted into various grades. The grading may be based on the signal to noise ratio measurements. In another embodiment of the invention, the grading can be based on the signal to noise ratio and other measurements or tests. The grades may be a high grade, medium grade and a low grade. The high grade may contain heads that satisfied the write width, signal to noise ratio requirements of the final disk drive that the head may be used to build. The heads in this high grade may be used in more expensive drives such as mobile or server hard drives. The high grade heads may be used in multi platter drives as the cost increases substantially as more platters are used.

The medium grade of the first group may be heads that satisfied the write width test but did satisfy the relaxed requirements on the signal to noise ratio tests. The heads from the medium grade may be used in single platter drives with a lower capacity than drives with high grade heads and thus optimizing cost.

The low grade may be composed of heads that satisfied the write width test but then did not satisfy the signal to noise ratio tests. In one embodiment, the low grade will be scrapped or thrown out. In another embodiment of the invention, the low grade heads may be used in lower capacity drives than both the high and medium grades, further optimizing costs.

In one embodiment of the invention, once the signal to noise ratios testing has been performed the second group of heads 202 may be sorted into grades. The grades may be a medium grade and a low grade. The sorting into grades may be based solely on signal to noise ratio measurements. In another embodiment of the invention, the sorting into grades may be based on signal to noise ratio measurements as well as other tests. The medium grade may be heads that didn't satisfy the write width tests but do satisfy relaxed or lower requirements and sufficiently satisfy the signal to noise ratio tests. The heads from the medium grade could be used in single platter drives with a lower capacity than drives with high grade heads and thus optimizing cost.

The low grade may be composed of heads that satisfied relaxed requirements of the write width test but then did not satisfy the signal to noise ratio tests. In one embodiment, the low grade will be scrapped or thrown out. In another embodiment, the low grade heads may be used in drives of capacities lower than the medium grade. In one embodiment of the invention, the medium and low grades from the first and second group may be combined and then used in drives according to the capacities they support.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and it's practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of testing recording heads for hard drives comprising:
   performing a magnetic write width test on a plurality of disk drive heads;
   sorting said plurality of heads into a first group and a second group based on said magnetic write width test;
   testing said first group for signal to noise ratios with adjacent tracks present under a first set of parameters, wherein said first set of parameters are based on said magnetic write width test;
   testing said second group for signal to noise ratios with adjacent tracks present under a second set of parameters, wherein said second set of parameters are based on said magnetic write width test.

2. The method of claim 1 further comprising:
   sorting said first group based on signal to noise ratio measurements into one or more grades.

3. The method of claim 1 further comprising:
   sorting said second group based on signal to noise ratio measurements into one or more grades.

4. The method of claim 1 further comprising:
   wherein the sorting of said first group of heads into grades including a high quality grade, a medium quality grade and a low grade.

5. The method of claim 1 further comprising:
   wherein the sorting of said second group of heads into grades including a medium quality grade and a low grade.

6. The method of claim 1 further comprising:
   performing overwrite testing concurrently with said magnetic write width test.

7. The method of claim 1 further comprising:
   performing stability testing concurrently with said magnetic write width test.

8. A method of testing recording heads for hard disk drives comprising:
   performing a magnetic write width test on a plurality of disk drive heads;
   sorting said plurality of heads into a first group and a second group based on said magnetic write width test;
   testing said first group for signal to noise ratios with adjacent tracks present on a plurality of portions of a disk with a first set of varying parameters, wherein said first set of varying parameters are based on said magnetic write width test;
   testing said second group for signal to noise ratios with adjacent tracks present on a plurality of portions of a disk with a second set of varying parameters, wherein said second set of varying parameters are based on said magnetic write width test;
   measuring a plurality of signal to noise ratios associated with each portion of said disk for said first group; and
   measuring a plurality of signal to noise ratios associated with each portion of said disk for said second group.

9. The method of claim 8 further comprising:
   sorting said first group based on signal to noise ratio measurements into one or more grades.

10. The method of claim 8 further comprising:
    sorting said second group based on signal to noise ratio measurements into one or more grades.

11. The method of claim 8 further comprising:
    wherein the sorting of said first group of heads into grades including a high quality grade, a medium quality grade and a low grade.

12. The method of claim 8 further comprising:
wherein the sorting of said second group of heads into grades including a medium quality grade and a low grade.

13. The method of claim 8 further comprising:
performing overwrite testing concurrently with said magnetic write width test.

14. The method of claim 8 further comprising:
performing stability testing concurrently with said magnetic write width test.

15. An apparatus for testing recording heads for hard disk drives comprising:
a magnetic tester performing a magnetic write width test on a plurality of disk drive heads, wherein said plurality of heads are sorted in a first group and a second group based on said magnetic write width test;
a signal to noise ratio tester for performing a signal to noise ratio tests with adjacent tracks present on said first group with a first set of parameters based on said magnetic write width test and on said second group with a second set of parameters based on said magnetic write width test.

16. The apparatus of claim 15 further comprising:
a sorter for sorting each of the plurality of heads in said first group and said second group based on signal to noise ratio measurements into one of a plurality grades.

17. The apparatus of claim 16 wherein said plurality of grades includes a high grade, medium and low grade.

18. The apparatus as recited in claim 15 wherein overwrite testing is performed concurrently with the magnetic write tests.

19. The apparatus as recited in claim 15 wherein stability testing is performed concurrently with the magnetic write test.

20. The apparatus as recited in claim 15 wherein the signal to noise ratio tester with adjacent tracks present tests for interference on a single or both sides of the track written by said plurality of disk heads.

* * * * *